US006816590B2

(12) United States Patent
Pike et al.

(10) Patent No.: US 6,816,590 B2
(45) Date of Patent: Nov. 9, 2004

(54) SYSTEM AND METHOD OF CONFIGURING A NETWORK ELEMENT

(75) Inventors: Dion Pike, Dunrobin (CA); Joey Chow, Nepean (CA); Jonathan Sprately, Ottawa (CA); Peter Serjak, Stittsville (CA); Stefano DeCecco, Ottawa (CA)

(73) Assignee: Alcatel Canada Inc., Kanata (CA)

( * ) Notice: Subject to any disclaimer, the term of this patent is extended or adjusted under 35 U.S.C. 154(b) by 95 days.

(21) Appl. No.: 10/012,429

(22) Filed: Dec. 12, 2001

(65) Prior Publication Data

US 2003/0059031 A1 Mar. 27, 2003

(30) Foreign Application Priority Data

Sep. 27, 2001 (CA) ............................................. 2358019

(51) Int. Cl.[7] ............................. H04M 3/00; H05H 7/20
(52) U.S. Cl. ...................... 379/329; 361/695; 361/727; 361/752; 361/796; 379/330; 379/332
(58) Field of Search ................................. 379/242, 329, 379/325, 326, 327, 328, 330, 331, 332, 224, 438, 268, 271, 292, 306; 361/690, 695, 697; 370/217, 353, 364, 419; 454/184

(56) References Cited

U.S. PATENT DOCUMENTS

| | | | | |
|---|---|---|---|---|
| 4,833,708 A | * | 5/1989 | Goodrich | 379/327 |
| 4,837,799 A | * | 6/1989 | Prohs et al. | 379/224 |
| 4,893,301 A | * | 1/1990 | Andrews et al. | 370/364 |
| 5,006,961 A | | 4/1991 | Monico | |
| 5,046,188 A | * | 9/1991 | Molnar | 379/93.07 |
| 5,063,476 A | * | 11/1991 | Hamadah et al. | 361/697 |
| 5,352,123 A | | 10/1994 | Sample et al. | |
| 5,596,569 A | * | 1/1997 | Madonna et al. | 370/217 |
| 5,812,553 A | * | 9/1998 | Pinault et al. | 370/419 |
| 5,887,158 A | | 3/1999 | Sample et al. | |
| 5,912,801 A | * | 6/1999 | Roy et al. | 361/690 |
| 5,999,621 A | * | 12/1999 | Martin et al. | 379/438 |
| 6,052,281 A | * | 4/2000 | Hardt et al. | 361/690 |
| 6,118,779 A | * | 9/2000 | Madonna | 370/353 |
| 6,208,522 B1 | | 3/2001 | Manweiler et al. | |
| 6,333,981 B1 | * | 12/2001 | Weir et al. | 379/325 |
| 6,459,579 B1 | * | 10/2002 | Farmer et al. | 361/695 |
| 6,554,697 B1 | * | 4/2003 | Koplin | 454/184 |

FOREIGN PATENT DOCUMENTS

WO    WO 01/57679 A1    8/2001

* cited by examiner

Primary Examiner—Harry S. Hong
(74) Attorney, Agent, or Firm—McCarthy Tétrault LLP

(57) ABSTRACT

A communication switch is provided for customer premise equipment. The switch comprises a communication module which processes communications between elements in the communication switch, a shelf module which has an interface point for the customer premise equipment to the communication module, and a chassis. The shelf module comprises an I/O card providing the interface point, a line processing card, a midplane providing a connections to the I/O card and the line processing card and connections for the midplane to the communication module. The shelf module communicates with the communication module via a communication link. The link may be connected and disconnected without disrupting operation of other shelf modules connected to said communication module.

22 Claims, 7 Drawing Sheets

FIG. 3C  FIG. 3D

SYSTEM AND METHOD OF CONFIGURING A NETWORK ELEMENT

FIELD OF THE INVENTION

The invention relates to a system and method of providing a flexible, modular architecture for a communication switch.

BACKGROUND OF INVENTION

In a communication switch, functionality is provided through a set of cards operating together to provide communication switching. For the cards, a midplane provides a physical connection means for a logical group of cards. Cards are plugged into connections on the midplane. The midplane provides common power, ground and data and control signals to each card and may provide internal connections for specific signals between cards.

While a convenient module is created by a populated midplane, there are disadvantages. For example, when a fault occurs on the midplane (e.g., an open or shorted circuit track or a faulty connector), the entire midplane must be replaced. Accordingly all components populated on the midplane must be disabled, even components which are unaffected by the midplane fault, while the midplane is being replaced.

There is a need for a system and method providing switching modularity that improves upon the prior art systems.

SUMMARY OF INVENTION

In a first aspect, a communication switch connecting a customer premise equipment to a communication network is provided. The communication switch comprises a communication module adapted to process communications between elements in the communication switch, a shelf module providing an interface point for the customer premise equipment to the communication module and a chassis comprising a mounting region for the shelf module. The shelf module comprises an input/output circuit card providing the interface point, a line processing card providing data processing of information transmitted between the customer premise equipment and the communication switch, a midplane arrangement and a sub-chassis housing the midplane arrangement, the line processing card and the input/output card. The midplane arrangement provides a first connection arrangement adapted to connect the input/output card to the midplane, a second connection arrangement adapted to connect the line processing card to the midplane, a third connection arrangement adapted to provide at least one signal connection at least one of the first connection and second connection arrangements to at least one of the input/output card and the line processing card, and a fourth connection arrangement adapted to provide the midplane arrangement with at least one signal connection for at least one of the first and second connection arrangements to the communication module. The shelf module communicates with the communication module via a communication link connecting the third connection arrangement to the communication module.

The communication switch may have the other shelf modules housed in the mounting region of the chassis.

The communication switch may have the shelf and one of the other shelf modules as being redundant components to each other.

The communication switch may have the shelf module and the other shelf modules as being coincidentally supportable by a floor of the mounting region.

The communication link may be connected and disconnected without disrupting operation of other shelf modules connected to the communication module.

The communication switch may have the shelf module securable to the chassis at a securing area at the top of the subchassis.

The communication switch may have the subchassis having an intake air passage and an exhaust air passage for ventilation flow provided by the communication switch.

The communication switch may have the intake air passage and the exhaust air passage individually selectively sealable from airflow upon an ambient temperature within the subchassis exceeds a safe threshold.

In a second aspect a modular shelf module for a communication switch for customer premise equipment is provided. The shelf module comprises an input/output circuit card providing the interface point, a line processing card providing data processing of information transmitted between the customer premise equipment and the communication switch, a midplane arrangement, and a chassis housing the midplane arrangement, the line processing card and the input/output card. The midplane arrangement provides a first connection arrangement for the input/output card to the midplane, a second connection arrangement for the line processing card to the midplane, a third connection arrangement adapted to provide at least one signal connection of at least one of the first connection and second connection arrangements to at least one of the input/output card and the line processing card, and a fourth connection arrangement for the midplane arrangement providing at least one signal connection for at least one of the first and second connection arrangements to the communication module. The shelf module communicates with a communication module in the communication switch via a communication link connecting the third connection arrangement to the communication module.

The shelf module and the other shelf modules may be mountable in a mounting region of a chassis of the communication switch.

The shelf module and the other shelf modules may be coincidentally supportable by a floor of the mounting region.

The communication link may be connected and disconnnected without disrupting operation of other shelf modules connected to the communication module.

The shelf module may be securable to the chassis at a securing area at the top of the chassis.

The shelf module may have the chassis further comprising an intake air passage and an exhaust air passage for ventilation flow provided by the communication switch.

The shelf module may have the intake air passage and the exhaust air passage as being individually selectively sealable from airflow upon an ambient temperature within the chassis exceeds a safe threshold.

In a third aspect, a network element for a communication network is provided. The network element comprises a first set of circuit cards comprising at least one circuit card arranged on one side of the network element, a second set of circuit cards comprising at least one circuit card arranged on an opposite side of the network element, and a set of midplane cards. Each network element comprises at least one midplane circuit card, with each of the midplane circuit cards adapted to connect at least one of the first set of circuit cards to at least one of the second set of circuit cards.

In a fourth aspect, a midplane arrangement for a network element is provided. The midplane arrangement comprises circuit cards arranged in a plane in a parallel spaced-apart arrangement on one side of the plane of midplane. These circuit cards define a first set of parallel planes which perpendicularly intersect the plane of midplane. The midplane arrangement also comprises a second set of circuit cards in a parallel spaced-apart arrangement on the other side of the plane of midplane. The second set of circuit cards define a second set of parallel planes which perpendicularly intersect the plane of midplane. Each midplane circuit card is adapted to connect at least one circuit card of the set of circuit cards to at least one circuit card of the second set of circuit cards.

In other aspects of the invention, various combinations and subset of the above aspects are provided.

BRIEF DESCRIPTION OF THE DRAWINGS

The foregoing and other aspects of the invention will become more apparent from the following description of specific embodiments thereof and the accompanying drawings which illustrate, by way of example only, the principles of the invention. In the drawings, where like elements feature like reference numerals (and wherein individual elements bear unique alphabetical suffixes):

FIG. 3C is a side view of the subshelf arrangement associated with the switch of FIG. 2;

FIG. 3D is a rear view of the subshelf arrangement associated with the switch of FIG. 2;

DETAILED DESCRIPTION OF THE EMBODIMENTS

Figure 1:
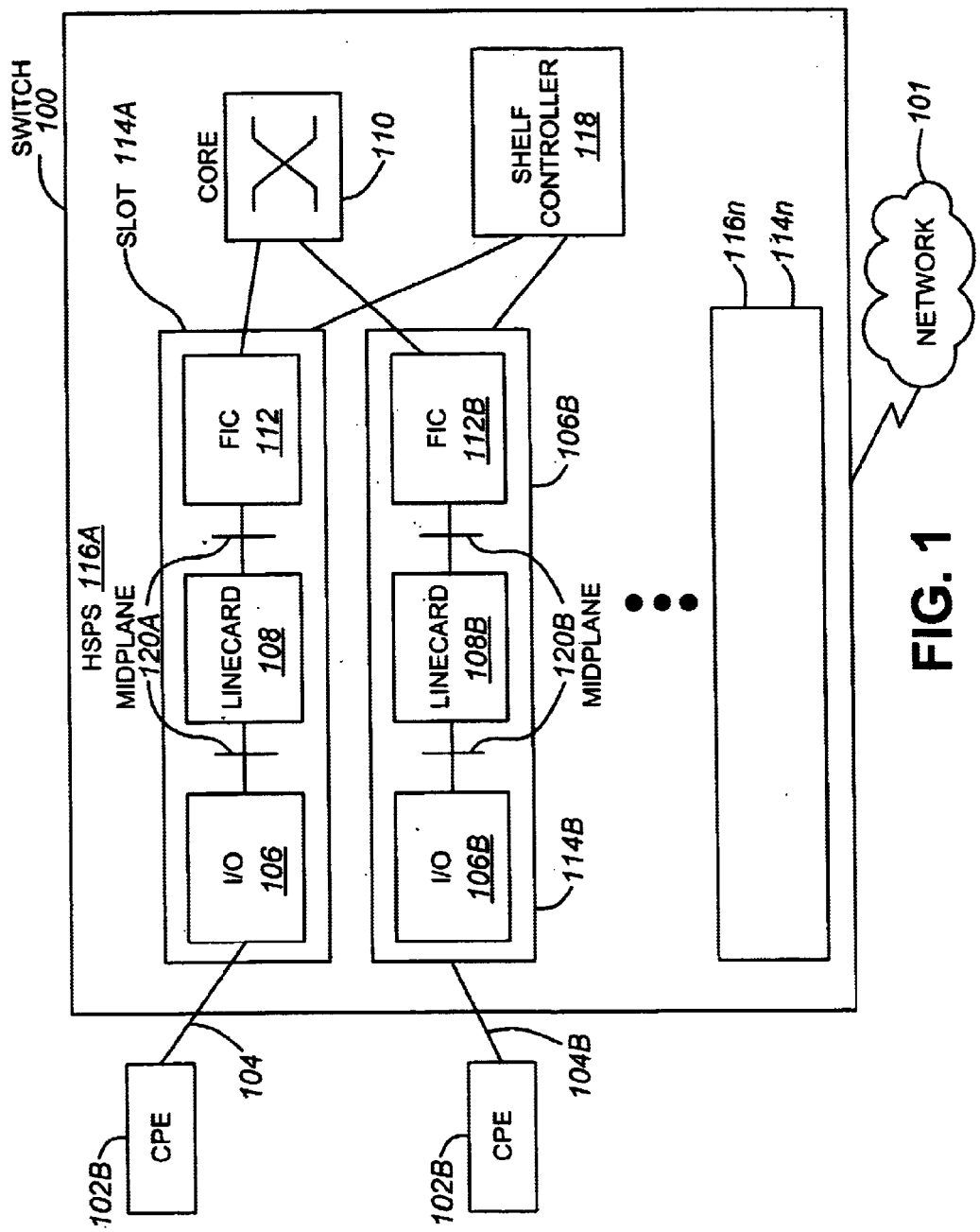
FIG. 1 is a block diagram of components of a switch embodying the invention.

The description which follows, and the embodiments described therein, are provided by way of illustration of an example, or examples, of particular embodiments of the principles of the present invention. These examples are provided for the purposes of explanation, and not limitation, of those principles and of the invention. In the description which follows, like parts are marked throughout the specification and the drawings with the same respective reference numerals.

Figure 2:
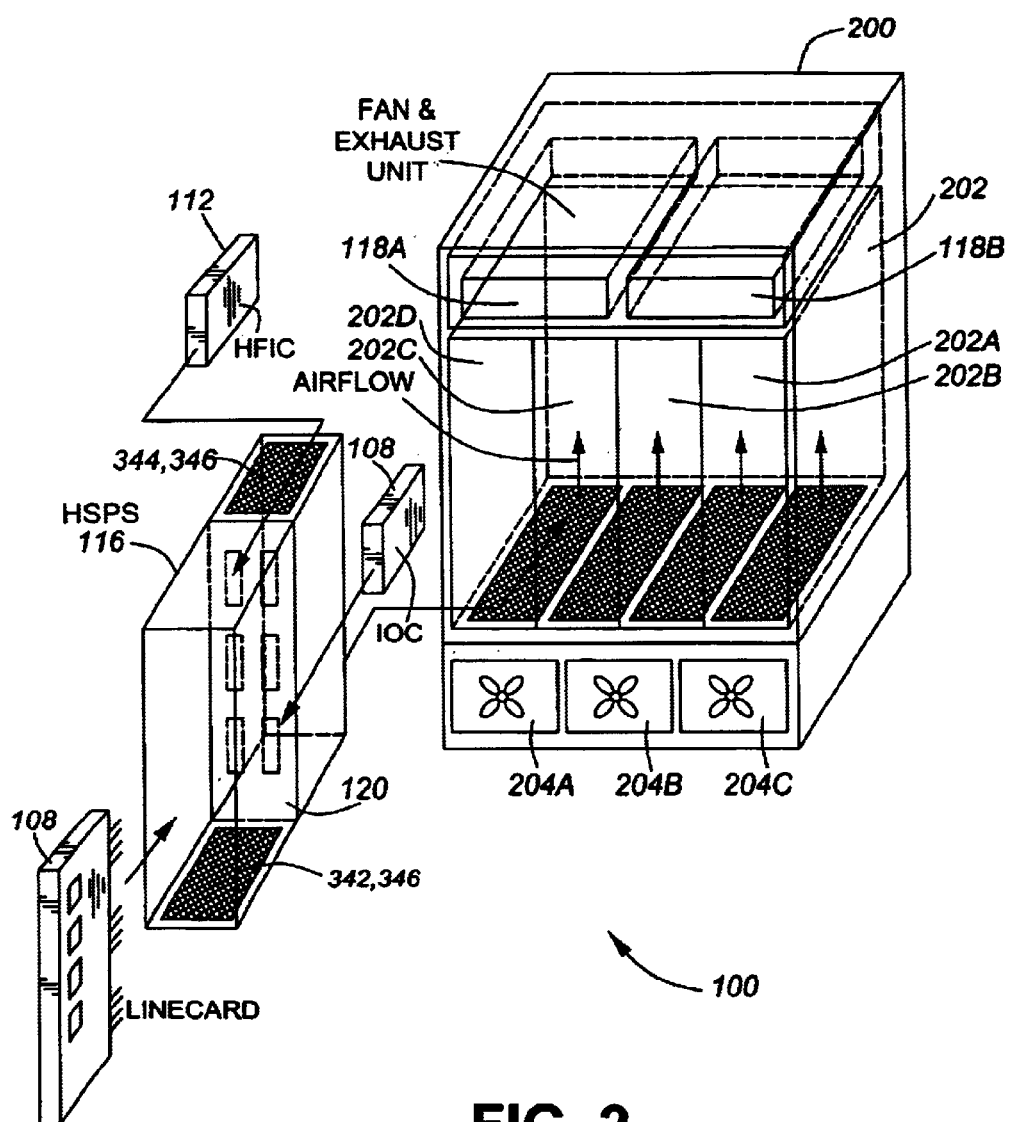
FIG. 2 is a block diagram of the switch, including a subshelf arrangement, of FIG. 1.

Referring to FIGS. 1 and 2, switch 100 is a multi-protocol backbone system, which can process both of ATM cells IP traffic through its same switching fabric. Switch 100 is connected to a communication network 101, allowing a customer premise equipment (CPE) 102 on one end of the network to communicate to a device at another end of the network. The CPE 102 may be a terminal, modem, computer or other device capable of communicating with another device. In the present embodiment, switch 100 allows scaling of the switching fabric capacity from 50 Gbps to 450 Gbps in increments of 14.4 Gbps simply by the insertion of additional switching shelves into switch 100.

It will be appreciated that terms such as "routing switch", "communication switch", "communication device", "switch" and other terms known in the art may be used to describe switch 100. Further, while the embodiment is described for switch 100, it will be appreciated that the system and method described herein may be adapted to any switching system.

In switch 100, CPE 102 is connected via a link 104 to switch 100 to I/O card 106. I/O card 106 provides the main interface for CPE 102 to switch 100 for its datastream. Link 104 may be an optical, electrical or wireless link. But for converting the datastream into a format for switch 100, I/O card 106 does not process the datastream. I/O card 106 sends the datastream from CPE 102 to line card 108. Line card 108 provides OC-192 functionality, ATM provisioning and ATM cell processing between core 110 of switch 100 and CPE 102. Each line card 108 is also connected to a fabric interface card (FIC) 112 which converts the datastream from the line card to an optical signal and sends the datastream to core 110. In core 110, the datastream is routed to an appropriate egress path, leaves core 110 and is provided to an egress path through an egress line card. For this example, the egress path may be through line card 108B. A terminal (not shown) is connected to routing switch 100 and runs controlling software, which allows an operator to modify, and control the operation of, switch 100. The overall operation and components of switch 100 are well known in the art, but for the embodiment described herein.

The line card 108, FIC 112 and I/O cards 106 are grouped on a midplane (described later) into a slot 114. Slots 114A, 114B, 114C and 114D may be grouped into a High Speed Peripheral Shelf (HSPS), represented as peripheral shelf 116. As a shelf, HSPS 116 may be provided with a redundant shelf 161B having a complementary set of slots 114 and cards 106, 108 and 112 to HSPS 116. Alternatively other shelves may be provided in switch 100 having different functions, for example switch control functions.

Shelf controller 118 is provided in switch 100 to arbitrate commands to each of the shelves 116.

Physically in the prior art, a shelf, like the HSPS 116, was embodied in a single midplane, spanning the width of the cabinet of switch 100. However, the embodiment provides the improvement of a plurality of subshelves one of each for peripheral shelf 116 and a system to allow cards on each subshelf to communicate with each other. In each subshelf 116, there is a midplane 120 which provides a physical substrate onto which local cards may be mounted. Further detail on the midplane 120 is provided below.

Referring to FIG. 2, physically, switch 100 of the embodiment comprises chassis 200 (shown in partial view) which has opening 202 therein, providing a mounting region for the shelves 116. Within opening 202, one of several subshelf modules, e.g., subshelf module 116A, may be inserted into one of four subslots 202A, 202B, 2024C or 202D of opening 202. Fan units 204A, 204B and 204C, located in a compartment beneath opening 202, provide forced-air cooling to modules 116. Air intake is through the base of shelf 116A, i.e. below fans 204, in an opening. Air exhaust is through the rear top section of shelf 200. The openings are described in detail later. Shelf controller circuits 118A and 118B are communication modules for switch 100 and provide centralized and modular control systems for each of subshelves 116A . . . 116D via individual communication links (not shown). It will be appreciated that other embodiments may have other communication modules providing centralized and other switching or controlling functionality for switch 100. In the embodiment, each subshelf 116 is separately connected to at least one of each shelf controller 118. In a fully redundant configuration, each subshelf 116 is connected to both shelf controllers 118A and 118B. The embodiment provides a connection arrangement allowing a subshelf to be connected and disconnected individually to its target shelf controller 118.

Referring to FIGS. 2 and 3A, 3B, 3C, 3D, 3E, 3F and 3G aspects of subshelf 116A are provided. Generally, sub shelf 116A is a subchassis to chassis 200 and is an elongated rectangular form having sides 300, top 302 and bottom 304.

Figures 3A, 3B:
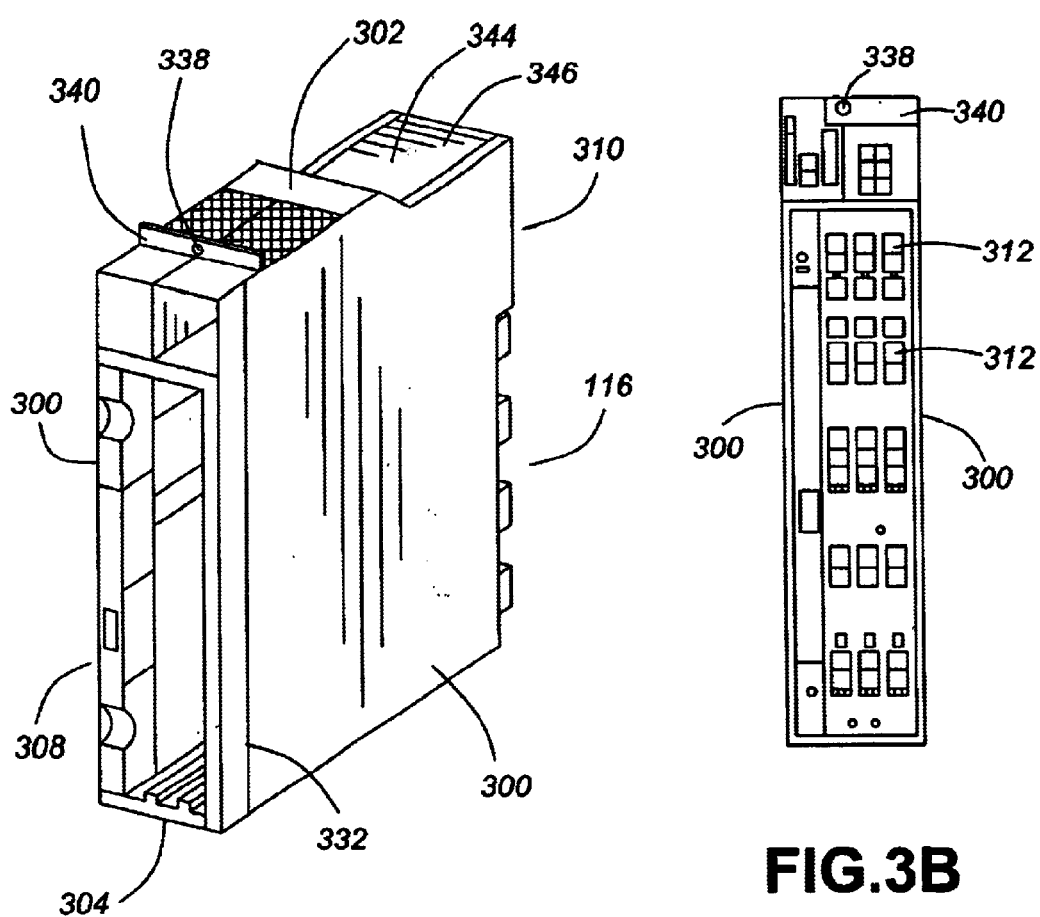
FIG. 3A is a front perspective view of the subshelf arrangement associated with the switch of FIG. 2.
FIG. 3B is a front view of the subshelf arrangement associated with the switch of FIG. 2.
Figure 3F:
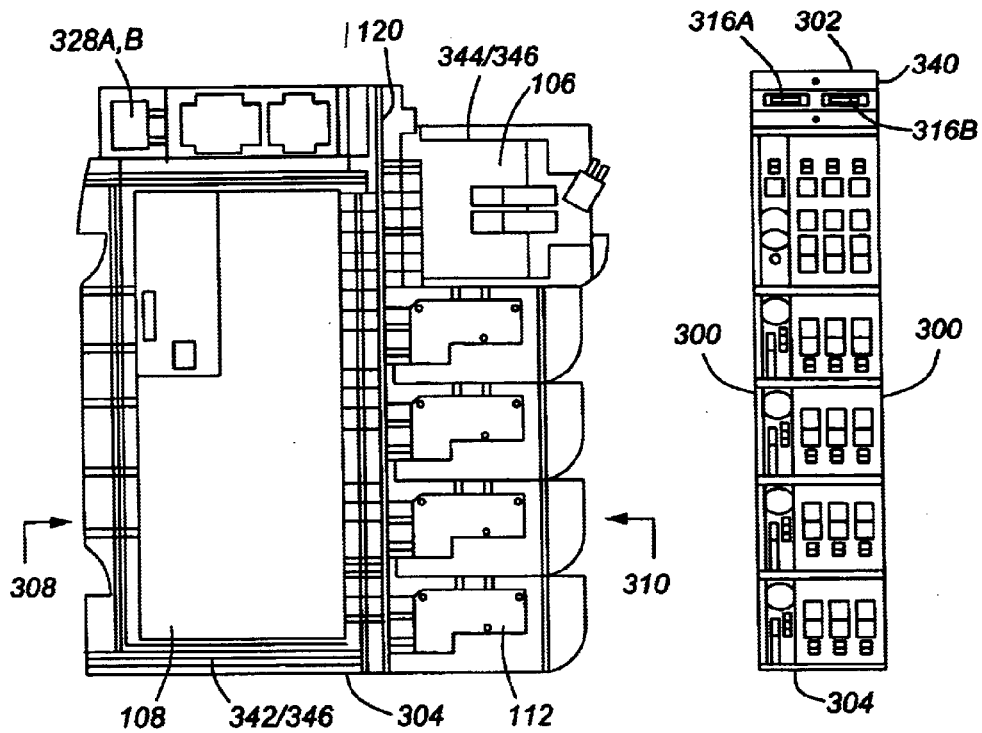
FIG. 3F is a partial end cut-away view of the subshelf arrangement associated with the switch of FIG. 2.
Figure 3F:
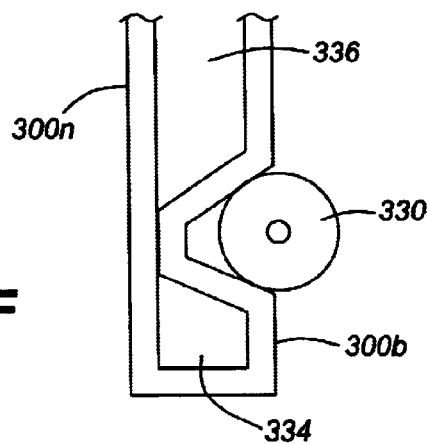
Figure 3E:
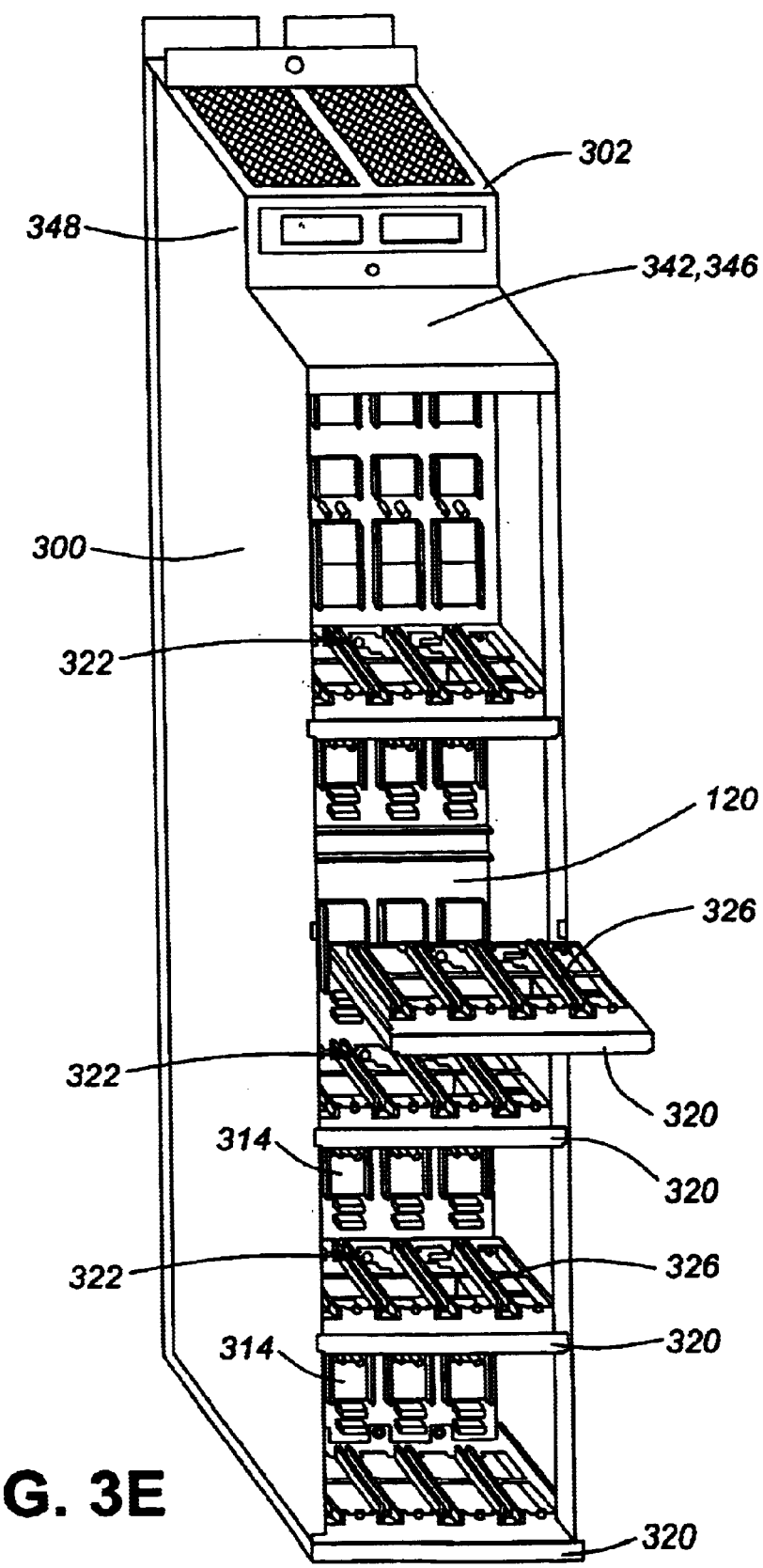
FIG. 3E is a rear perspective view of the subshelf arrangement associated with the switch of FIG. 2.
Figure 3G:
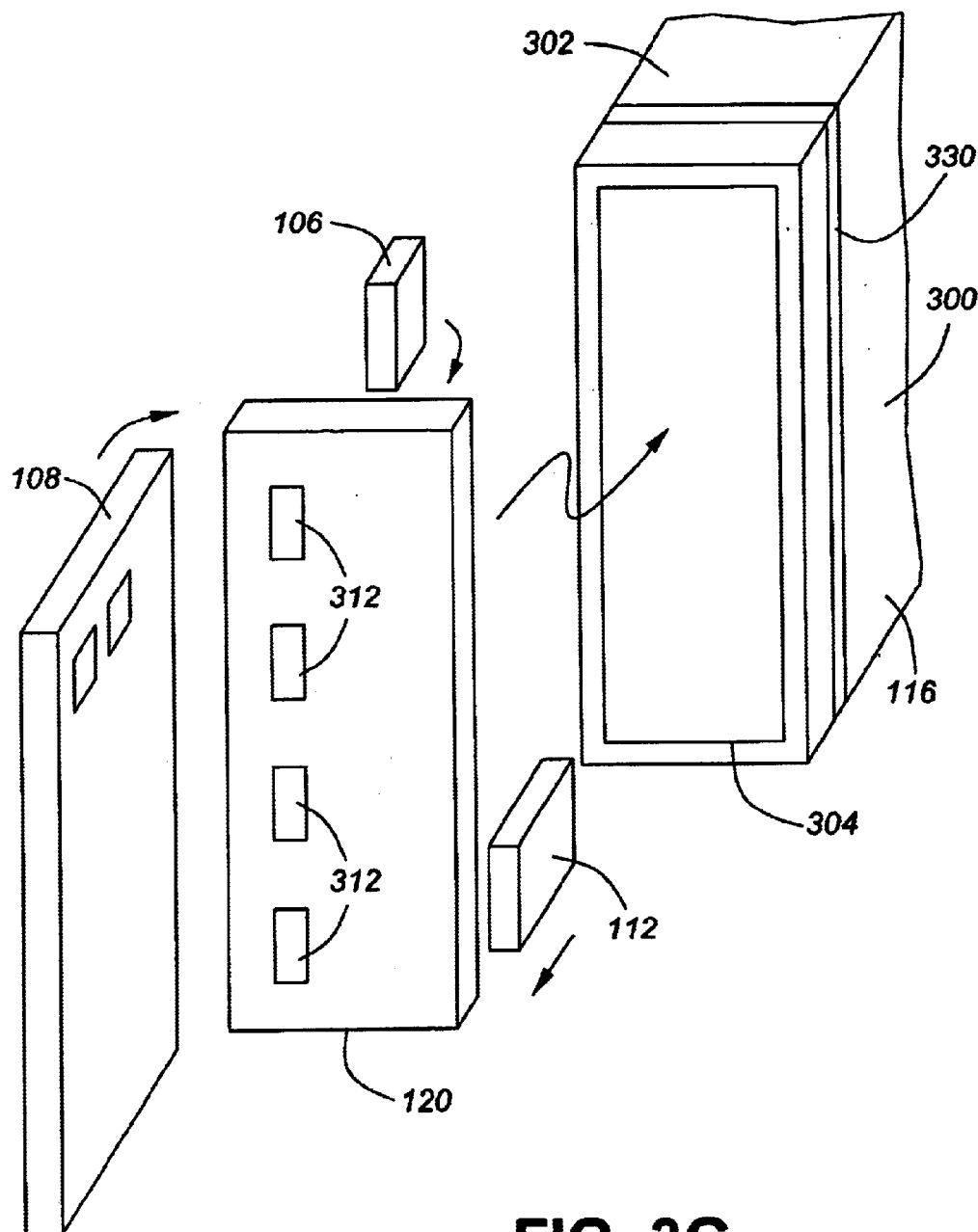
FIG. 3G is a profile view of a midplane arrangement associated with the subshelf arrangement of FIGS. 3A–3F.

Referring to FIG. 3F, in the embodiment, subshelf 116A is constructed of steel. The steel construction provides a Faraday-type shield from neighbouring electromagnetic sources. Further shielding is provided by a gasket 330, which surrounds the edge of subshelf unit 116A along ridge 332.

At bottom 304 in opening 342, opening 342 is covered with honeycomb material 346. Similarly, at top 302 in opening 344, opening 344 is covered with honeycomb material 346. The honeycomb material 346 normally allows air to flow through its cells, but disintegrates and seals its cells under high temperature conditions. Accordingly, when there is a fire or high heat condition inside subshelf 116A, the top and bottom honeycomb material 346 would seal themselves, thereby sealing the interior of subshelf 116A from an exterior supply of oxygen. Accordingly, any internal fire or high heat condition in subshelf 116A would be contained within itself and would be isolated from an external oxygen supply.

In the embodiment, subshelf 116A has a width of approximately 120 mm and a height of approximately 650 mm. The aspect ratio of height to width of subshelf 116A requires that the stiffness of the sides 300 do not deflect under the gasket 330 load. Accordingly the front outer edge of side 300 is a side having a generally flat surface on the interior 300A and a shaped exterior 300B providing a generally first rectangular pocket at 334, followed by an indentation 332 for gasket 330 followed by another pocket at 336. Accordingly, the profile of subshelf 116A is that of an upright elongated box having a deep depth. It will be appreciated that other physical profiles may be used in other embodiments.

Again, referring to FIGS. 3A–3G, for airflow and cooling, on top 302 of subshelf 116A, grid 318 provides a flow-through vent for air to cool components contained within subshelf 116A. Power for subshelf 116A is provided externally. However, redundant power conditioning modules 328A and 328B are provided to condition and regulate power signals provided to components in sub shelf 116A.

Screw holes 338 are located on top 302 in a flange 340 traversing from side 300 to opposite side 300. Screw hole 338 provides a securing area for screws to secure subshelf 116A to a corresponding receptacle in chassis 102. Accordingly, the weight of subshelf 116A rests on the floor of by cavity 202, while the secured subshelf 116A is prevented from lateral movement by the friction connection of the screw mounted through holes 338 for subshelf 116A. This securement system provides a "swinging" securement system, which allows the subshelf 116A to be more resilient under severe vibration conditions, e.g., during earthquakes. It will be appreciated that other securing systems may be used, such as pins, which provide the "swinging" connection properties, described above.

Figure 4:
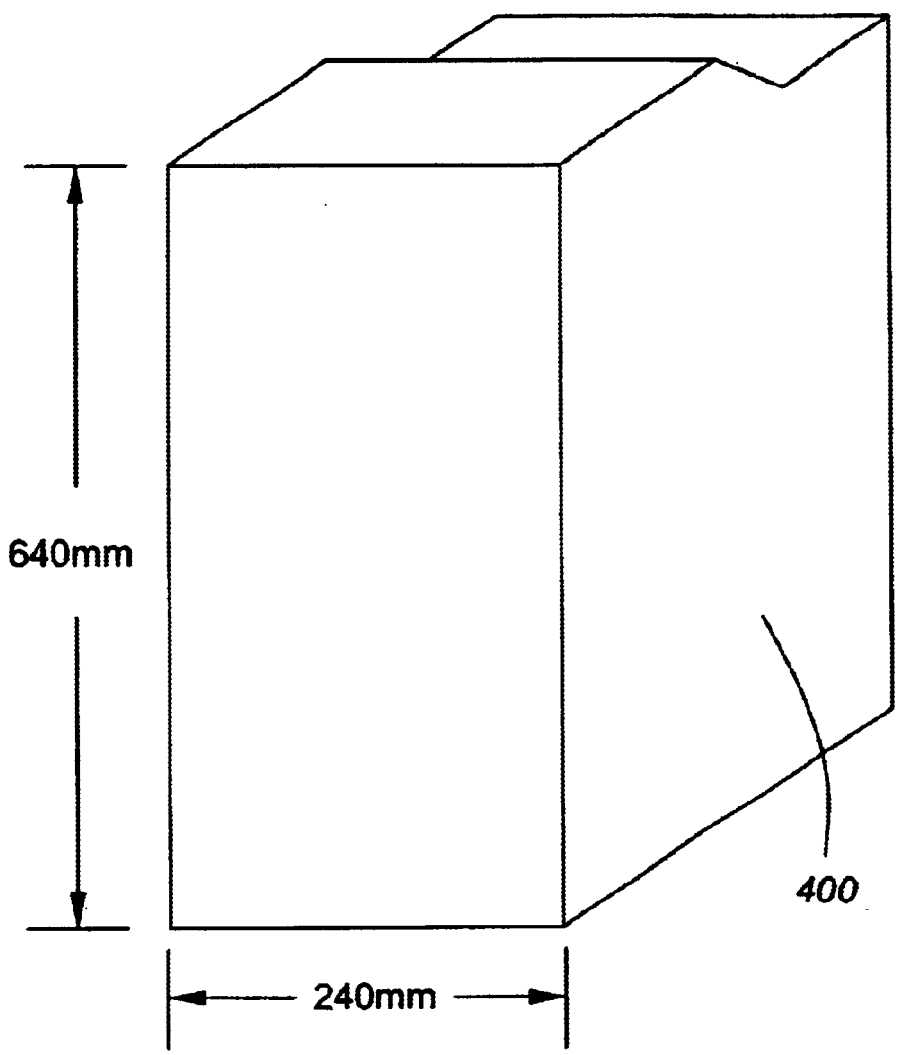
FIG. 4 is a profile view of another subshelf arrangement associated with the switch of FIG. 2.

Accordingly, opening 202 may be populated with a plurality of subshelves 116 having similar dimensions or a mix of subshelves 116 having different dimensions, in particular, different widths. Within the dimensions of a subshelf 116, it is further possible to develop custom midplanes for components specifically for that particular midplane. Accordingly, the embodiment provides greater flexibility in developing interface mechanisms to communicate with shelf controller 118. Referring to FIG. 4, subshelf 400 is shown which is an exemplary double-width shelf relative to subshelf 116 having a width of 240 mm and a height of 640 mm. It will be appreciated that custom, double width cards may be populated therein.

Referring to FIG. 2 and FIGS. 3A–3G, midplane assembly 120 has connections enabling line card 108, I/O card 106 and FIC cards 112 to communicate with each other and with external elements, such as shelf controller 118. Conductive tracks through midplane 120 connect selected pins in connector 316A to selected pins in connector 316B. Further, connectors 316A and 316B provide an link to shelf controllers 118 via appropriate cables (not shown). In the embodiment, subshelves 116 are connected to the shelf controller 118 via optical control service links (CSLs) and are connected to the core 110 via high speed inter shelf links (HISLs). For EMI protection, a cage has been provided around connectors 316A and 316B. The cage comprises a metal gasket 348 comprising metal strips which laterally surround the connectors 316 behind the exterior face of sub shelf 116.

In subshelf 116A, a midplane assembly 120 spans between each side 300 and from top 302 to bottom 304 and is fully contained within subshelf 116A. The midplane 306 has front area 308 and back area 310, separating the subshelf 116A into a front and rear portion. On front area 308, connectors 312 are provided to allow cards to be inserted into the front portion of subshelf 116. On the rear 310, connectors 314 are provided to allow other cards to be connected to the rear of midplane 120. In the rear section of subshelf 116A, cross members 320 span between sides 300 and segment the rear portion of subshelf 116A into a plurality of vertical subunits 322. Each cross member 320 may be secured to midplane 120 via screw 322 through an aperture (not shown) in cross member 320. Each cross member 320 has slots 326 to guide cards as they are being inserted into their respective connectors 314. It will be appreciated that the connectors and the cross members 320 may be configured in different embodiments to have different size region(s) therein.

In the embodiment line card 108 may be inserted into the front of subshelf 116 and connected to midplane 306 via connectors 312. Similarly, I/O cards 106 may connect to connectors 314 to provide a connection between line cards 108 and 110 cards 106.

It will be appreciated that having several smaller midplanes in subshelves 116 in a switch 100 provides a less expensive circuitboard for each midplane as opposed to a single, larger midplane. It will be appreciated that collectively, the subshelves provide an architecture where individual shelves provide modular redundant components or modular complementary components for switch 100. It is notable that a switch utilizing a prior art single midplane architecture which would span the entire back of cavity 202 has the disadvantage that any failure in the midplane would require the disconnection of all components connected thereto, even components not affected by the failure in the midplane, in order to replace and correct the error in the midplane.

The features and advantages of this embodiment are as follows:

1) reliability and serviceability is improved for the routing switch;
2) network redundancy is provided mechanically within a shelf;
3) design of shelf midplane is simplified; and
4) expansion and upgrading of a sub-shelf for a midplane can be accomplished without affecting the rest of the shelf.

It is noted that those skilled in the art will appreciate that various modifications of detail may be made to the present embodiment, all of which would come within the scope of the invention.

We claim:

1. A modular communication switch comprising a chassis having a mounting region for electrical interconnection with a plurality of removable shelf modules, each shelf module comprising a midplane arrangement for operatively connecting a plurality of removable peripheral components thereto, wherein the midplane arrangement provides signal connections therewith enabling at least two of said plurality of removable peripheral components to communicate with each other and enabling at least one of said plurality of removable peripheral components to communicate with said chassis, and wherein each removable shelf module and all removable peripheral components connected thereto are collectively housed in a subchasis.

2. The modular communication switch according to claim 1, further comprising a chassis controller operatively connected to said chassis for processing communications with each of said plurality of removable shelf modules.

3. The modular communication switch according to claim 2, wherein at least one of said plurality of removable shelf modules has an interface point for connecting with customer premise equipment.

4. The modular communications switch according to claim 3, wherein said plurality of removable peripheral components includes an input/output circuit card that provides said interface point.

5. The modular communications switch according to claim 4, wherein said plurality of removable peripheral components includes a line processing circuit card providing data processing of information transmitted between said customer premise equipment and said modular communications switch.

6. A modular communication switch as claimed in claim 5 wherein one of said plurality of shelf modules and another one of said plurality of shelf modules are redundant components to each other.

7. A modular communication switch as claimed in claim 6 wherein said one of said plurality of shelf module and said other one of said plurality of shelf modules are coincidentally supportable by a floor of said mounting region.

8. A modular communication switch as claimed in claim 7 wherein said each shelf module is securable to said chassis at a securing area at the top of said subchassis.

9. A modular communication switch as claimed in claim 8 wherein at least one of said plurality of removable shelf modules is mountable to and dismountable from said mounting region without disrupting processing of communications by the chassis controller with other shelf modules of said plurality of removable shelf modules mounted to said mounting region of said chassis.

10. A modular communication switch as claimed in claim 9 wherein said subchassis provides an intake air passage and an exhaust air passage for cooling ventilation provided by said communication switch.

11. A modular communication switch as claimed in claim 10 wherein said intake air passage and said exhaust air passage are individually selectively sealable from airflow upon an ambient temperature within said subchassis exceeds a safe threshold.

12. A removable shelf module for a modular communication switch, the modular communications switch comprising a chassis having a mounting region for electrical interconnection with more than one said removable shelf module, the removable shelf module comprising a midplane arrangement for operatively connecting a plurality of removable peripheral components thereto, wherein said midplane arrangement provides signal connections therewith enabling at least two of said plurality of removable peripheral components to communicate with each other and enabling at least one of said plurality of removable peripheral components to communicate with said chassis, and wherein the removable shelf module and all peripheral components connected thereto are collectively housed in a subchassis.

13. The removable shelf module according to claim 12, wherein said shelf module is operatively connected to a chassis controller, said chassis controller being operatively connected to said chassis for processing communications with each of said more than one removable shelf modules.

14. The removable shelf module according to claim 13, further comprising an interface point for connecting with customer premise equipment.

15. The removable shelf module according to claim 14, wherein said plurality of removable peripheral components includes an input/output circuit card that provides said interface point.

16. The removable shelf module according to claim 15, wherein said plurality of removable peripheral components includes a line processing circuit card providing data processing of information transmitted between said customer premise equipment and said modular communications switch.

17. A removable shelf module as claimed in claim 16 wherein said shelf module and said more than one removable shelf modules are mountable in a mounting region of said chassis of said modular communication switch.

18. A removable shelf module as claimed in claim 17 wherein said shelf module and said more than one removable shelf modules are coincidentally supportable by a floor of said mounting region.

19. A removable shelf module as claimed in claim 18 wherein said shelf module is securable to said chassis at a securing area at the top of said chassis.

20. A removable shelf module as claimed in claim 19 wherein said chassis further comprises an intake air passage and an exhaust air passage for cooling ventilation provided by said communication switch.

21. A removable shelf module as claimed in claim 20, wherein said shelf module may be mounted to and dismounted from said mounting region without disrupting processing of communications by the chassis controller with other shelf modules of said more than one removable shelf modules mounted within said mounting region of said chassis.

22. A removable shelf module as claimed in claim 21 wherein said intake air passage and said exhaust air passage are individually selectively sealable from airflow upon an ambient temperature within said chassis exceeds a safe threshold.

* * * * *

UNITED STATES PATENT AND TRADEMARK OFFICE
CERTIFICATE OF CORRECTION

PATENT NO. : 6,816,590 B2
DATED : November 9, 2004
INVENTOR(S) : Dion Pike et al.

It is certified that error appears in the above-identified patent and that said Letters Patent is hereby corrected as shown below:

<u>Title page,</u>
Item [75], Inventors, "Sprately" should read -- Spratley --.

<u>Drawings,</u>
Sheet 2, Figure 2, reference numeral "206" should read -- 120 --.
Sheets 4 and 5, Figures 3C and 3E, reference numeral "306" should read -- 120 --.

<u>Column 3,</u>
Lines 48-49, add the word -- and -- between "ATM cells" and "IP traffic".

<u>Column 4,</u>
Line 26, "161B" should read -- 116B --.
Line 51, "below" should read -- above --.

<u>Column 5,</u>
Line 33, "grid 318" should read -- opening 344 --.
Line 40, "102" should read -- 200 --.
Line 44, "by" should be removed.

<u>Column 6,</u>
Lines 14 and 32, "306" should read -- 120 --.

<u>Column 7,</u>
Line 32, "module" should read -- modules --.
Line 52, "exceeds" should read -- exceeding --.

UNITED STATES PATENT AND TRADEMARK OFFICE
CERTIFICATE OF CORRECTION

PATENT NO. : 6,816,590 B2
DATED : November 9, 2004
INVENTOR(S) : Dion Pike et al.

It is certified that error appears in the above-identified patent and that said Letters Patent is hereby corrected as shown below:

<u>Column 8,</u>
Line 55, "exceeds" should read -- exceeding --.

Signed and Sealed this

Eighteenth Day of October , 2005

JON W. DUDAS
*Director of the United States Patent and Trademark Office*